United States Patent [19]

Suzuki et al.

[11] Patent Number: 4,905,317

[45] Date of Patent: Feb. 27, 1990

[54] PATH MEMORY CONTROL METHOD IN VITERBI DECODER

[75] Inventors: Hideo Suzuki, Kawasaki; Masato Tajima, Tokyo, both of Japan

[73] Assignee: Kabushiki Kaisha Toshiba, Kawasaki, Japan

[21] Appl. No.: 143,169

[22] PCT Filed: Apr. 2, 1987

[86] PCT No.: PCT/JP87/00207

§ 371 Date: Dec. 1, 1987

§ 102(e) Date: Dec. 1, 1987

[87] PCT Pub. No.: WO87/06081

PCT Pub. Date: Oct. 8, 1987

[30] Foreign Application Priority Data

Apr. 3, 1986 [JP] Japan ................................. 61-75434
Aug. 14, 1986 [JP] Japan ............................... 61-189561

[51] Int. Cl.$^4$ .......................................... H03M 13/22
[52] U.S. Cl. ..................................... 341/51; 341/81; 371/43
[58] Field of Search ................ 341/51, 81, 50, 107; 371/43

[56] References Cited

U.S. PATENT DOCUMENTS

| | | | |
|---|---|---|---|
| 4,545,054 | 10/1985 | Davis | 371/43 |
| 4,583,078 | 4/1986 | Shenoy et al. | 341/51 |
| 4,614,933 | 9/1986 | Yamashita et al. | 341/51 |
| 4,677,624 | 6/1987 | Betts et al. | 341/81 |
| 4,677,625 | 6/1987 | Betts et al. | 371/43 |
| 4,677,626 | 6/1987 | Betts et al. | 341/81 |
| 4,709,377 | 11/1987 | Martinez et al. | 371/43 |

FOREIGN PATENT DOCUMENTS 55-42440  3/1980 Japan.
59-19455  1/1984 Japan.
60-77528  5/1985 Japan.

OTHER PUBLICATIONS

COMSAT Technical Review, vol. 13, No. 2, pp. 315-329; A. Shenoy and P. Johnson; 1983.
IEEE Transactions on Communications, vol. Com. 29, No. 9, Sep. 1981, Charles M. Rader, "Memory Management in a Vitervi Decoder", pp. 1399-1401.

Primary Examiner—William M. Shoop, Jr.
Assistant Examiner—Helen Kim
Attorney, Agent, or Firm—Oblon, Spivak, McClelland, Maier & Neustadt

[57] ABSTRACT

A path memory control method in a Viterbi decoder outputs, when a plurality of decoding steps are required to trace back to a final stage of a surviving path, the same number of decoded data as that of the decoding steps required for trace-back, thereby determining the decoded data. During trace-back, state transition information throughout a plurality of times can be combined with each other, and the final stage of the surviving path can be traced back by jumping back a plurality of stages, at a time, by reducing the number of memory access, thereby realizing high-speed decoding.

6 Claims, 10 Drawing Sheets

PATH LENGTH = 64 BIT (64 = 32 X 2)

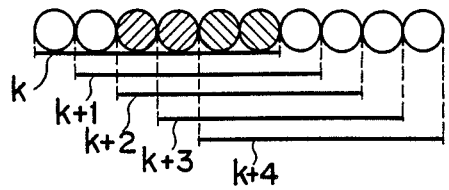

① WRITING OF STATE TRANSITION INFORMATION AT SUCCEEDING TIMES k AND k+1
⇒ DECODE OLDEST 2 BITS IN STATE OF (k+2)

② WRITING OF STATE TRANSITION INFORMATION AT SUCCEEDING TIMES k+2 AND k+3
⇒ DECODE OLDEST 2 BITS IN STATE OF (k+4)

F I G. 5A

PATH LENGTH = 128 BIT (128 = 32 X 4)

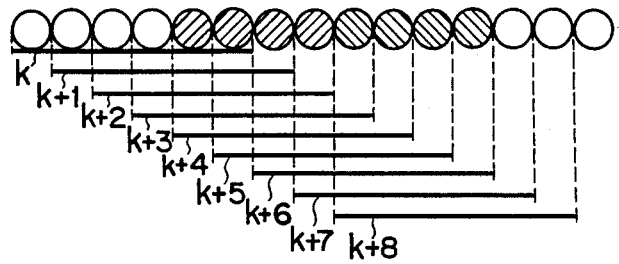

① WRITING OF STATE TRANSITION INFORMATION AT SUCCEEDING TIMES k, k+1, k+2, AND k+3
⇒ DECODE OLDEST 4 BITS IN STATE OF (k+4)

② WRITING OF STATE TRANSITION INFORMATION AT SUCCEEDING TIMES k+4, k+5, k+6, AND k+7
⇒ DECODE OLDEST 4 BITS IN STATE OF (k+8)

F I G. 5B

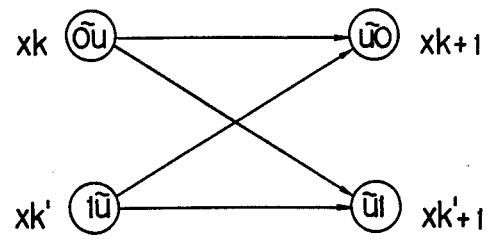
WHERE $\tilde{u} \triangleq (u_{k-K+3}, u_{k-K+4} \cdots u_k)$
F I G. 7
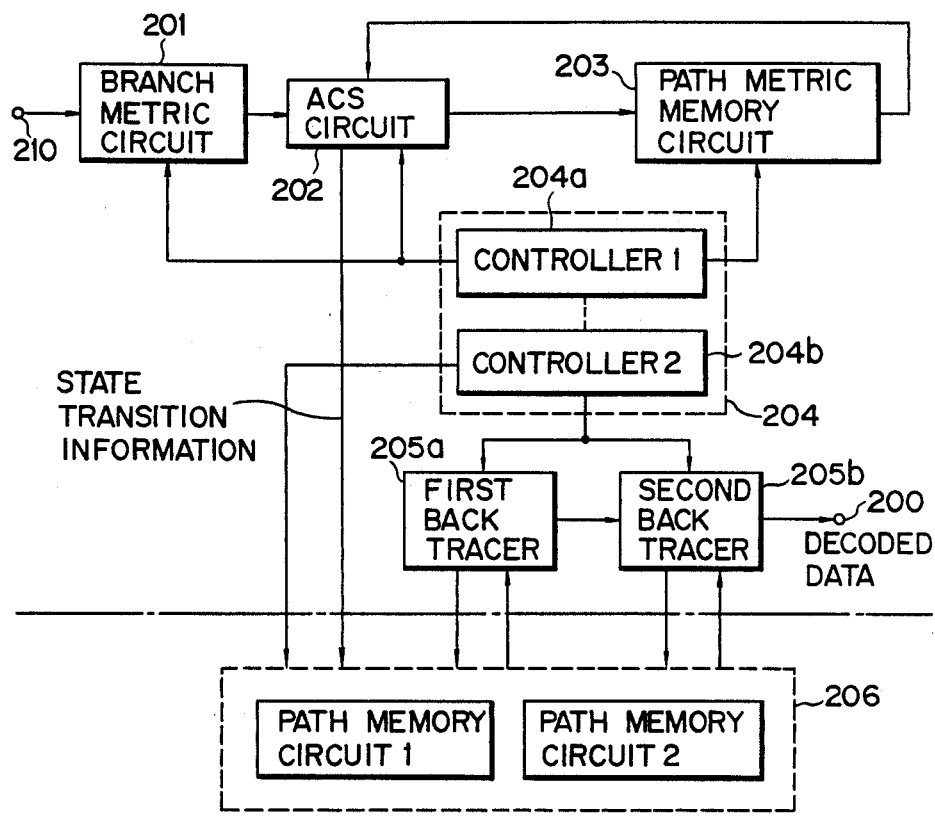
F I G. 8

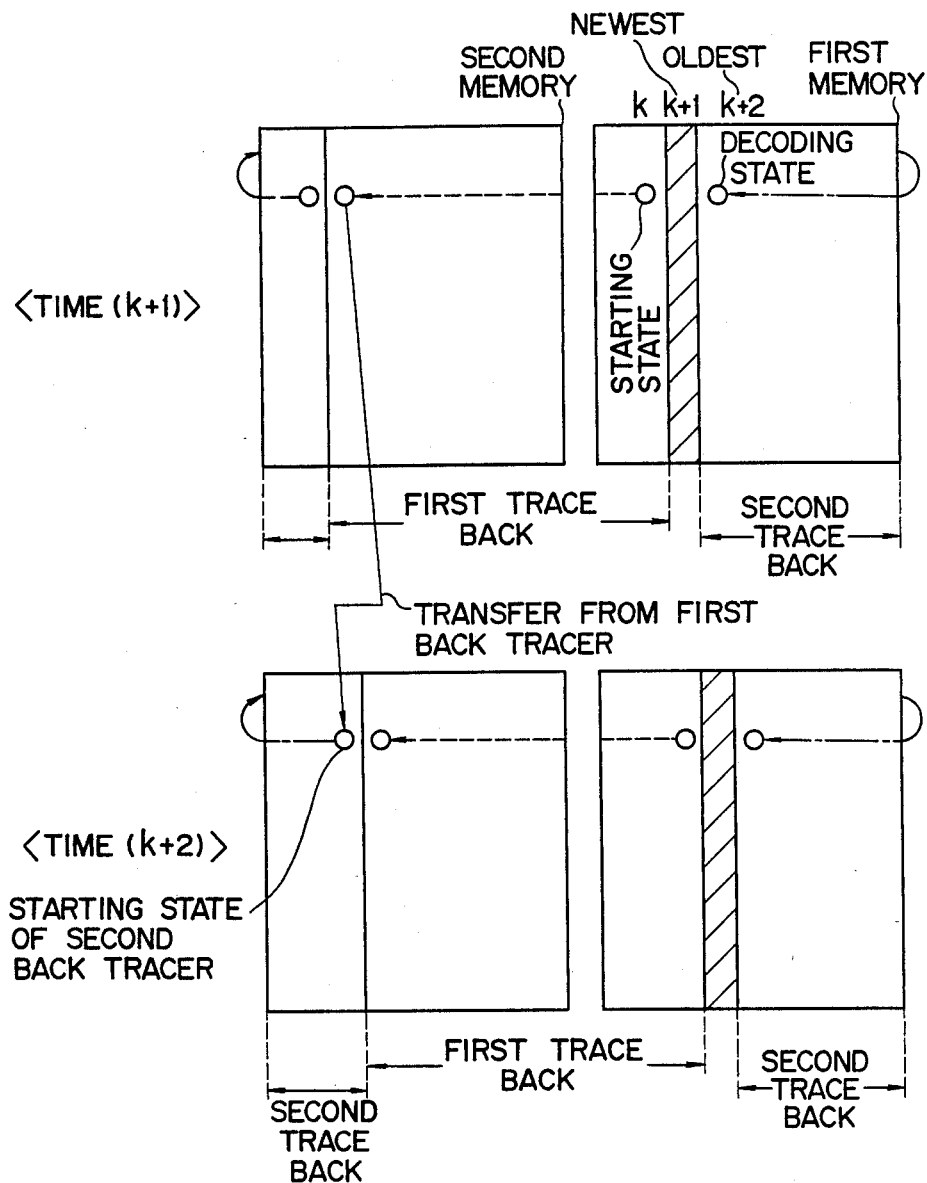
F I G. 9

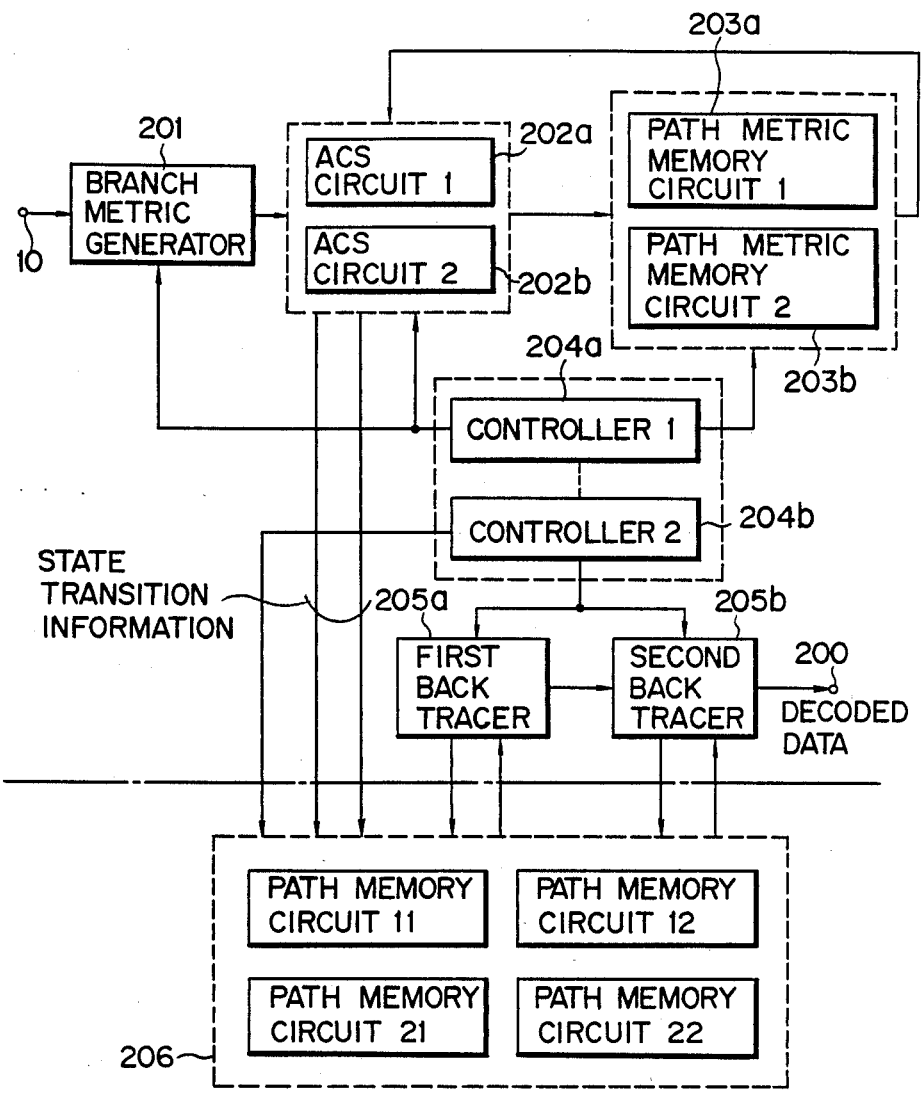
F I G. 10

PATH MEMORY CONTROL METHOD IN VITERBI DECODER

TECHNICAL FIELD

The present invention relates to a path memory control method in a Viterbi decoder in which the method of accessing a path memory used for trace back is novel.

BACKGROUND ART

In order to perform decoding operation in a Viterbi decoder, paths of finite lengths each to serve as a candidate for a most probable path as a transmission path are called survivor paths and stored in a path memory with respect to states on a code trellis of interest.

A bit which is common to previous surviving paths of a length about 4 to 5 times a code constraint length, in which the above survivor paths are assumed to effectively converge into one path, is output as decoded data.

In this case, the survivor paths are stored as follows:

In consideration of a unit cell structure of a trellis diagram as shown in FIG. 2A, state transition information between adjacent times (i.e., 1-bit information representing that which is more probable that state $X_{k+1}$ at a time $(k+1)$ is reached from state $X_k$ or from state $X_k'$ at a time immediately before time $(k+1)$) is stored in a corresponding memory circuit.

Such 1-bit state transition information is called trellis connection data and is stored, with respect to each state, for each decoding step.

Therefore, in order to execute decoding on the basis of surviving paths thus stored, it becomes necessary to trace backward on the basis of preceding state transition information from the most probable state at time k (in which the probability of the surviving path stored with respect to this state is larger than that of any surviving path stored with respect to any other state), and decoded data is determined in accordance with state $X_{k-v}$ (where v is a surviving path length) which is finally reached. That is, so-called "trace back" must be performed.

In this case, basically, if trace back from time k to time k−v is not completed during one decoding step, decoded data cannot be output. In order to explain this more clearly, assume that a surviving path memory circuit is realized by a random-access memory as shown in FIG. 3, and that an ordinate direction corresponds to a trellis state and an abscissa direction corresponds to a time axis. Especially, assume that a decoding operation at time k is completed and a decoding operation of time $(k+1)$ is started.

State transition information determined by an operation unit on the basis of a Viterbi algorithm are sequentially written in a memory in the vertical direction. In this case, in order to perform decoding, trace back must be executed in the horizontal direction before writing is completed and must reach, for example, the left end of the memory shown in FIG. 3.

In this case, trace back means repetition of a cycle such as accessing of an address → reading of state transition information → determination of an address to be accessed (at an immediately preceding time). Therefore, normally, writing of state transition information in the memory and track back operation are alternately performed.

However, as is apparent from FIG. 3, if the number of trellis states is different from the surviving path length (e.g., if the memory of FIG. 3 is a rectangle elongated in the horizontal direction), trace back does not reach the left end, even when writing of state transition information is completed with respect to all the states at time $(k+1)$.

Moreover, assume that the numbers of trellis states and the surviving path length are the same with each other, and that the circuit configuration of a decoder is such that state transition information with respect to a plurality of states can be obtained at the same time. In this case, if these state transition information are written in a memory at a time, when the writing operation is completed with respect to all the states, trace back can be executed by only a portion of the path length. That is, the surviving paths can be traced back to only an intermediate stage. As a result, conventionally, it is difficult to conveniently control the memory, unless proper matching is achieved between the number of trellis states and the survivor path length.

However, depending on an S/N ratio of input data supplied to a decoder, there often appears a demand to increase a surviving path length or a degree of freedom of a circuit configuration of an operation unit. Management of a path memory according to other decoding methods is exemplified in IEEE "TRANSACTION OF COMMUNICATIONS", VOL. COM 29, No. 9, SEPTEMBER 1981. However, no drastic improvement in techniques is described therein.

DISCLOSURE OF INVENTION

The present invention has been made in consideration of the above situation, and its object is to provide a path memory control method in a Viterbi decoder, comprising a trace back structure which can flexibly cope with a variation in a path length of surviving paths to be stored or a variation in the number of state transition information obtained at the same time.

A trace back on a surviving path memory circuit is basically made to a final stage on a surviving path for each decode step. It is sufficient to obtain one decoded data for each decode step in terms of how decoded data is obtained. The present invention is based on the aforementioned concept and is characterized by the manner in which state transition information is obtained for a state on a code trellis diagram (depending on the circuit configuration of a decode computation unit) or the manner by which a path memory is controlled so as to flexibly cope with a variation in a surviving path length. The most direct method is such that, if a plurality of steps are required in a trace back to a final stage on the surviving path, a plurality of decoded data equal in number to the number of the decode steps involved, not only one decoded data, are delivered as an output.

That is, one stage trace back is implemented each time the state transition information (normally a plural number at a time) obtained in a computation unit of the decoder is written into the surviving path memory circuit. Unless the trace back to a final stage on the surviving path is not completed at a time when the state transition information has been written for all the states at a time of interest, the writing of the state transition information and corresponding trace back at the next time are continued and those data corresponding in number to the number of decode steps involved at the trace back are decoded, all at a time, at a point of time when the trace back to the final stage on the surviving path has been completed.

In another method, if the trace back on the path memory requires a plurality of times (N+) the aforementioned time relative to the writing of the state transition information into the path memory, then the path memory length is divided into N+ number of intervals and N+ number of devices, i.e., back tracers, are provided so as to independently trace back the corresponding divided intervals.

In this case, when the back tracer corresponding to the latest area on the surviving path arrives at the final stage on the surviving path for each decoding time, the decoded data are sequentially delivered at a rate of one per decoding time.

In another memory control method, a path select signal (state transitiion information between adjacent times) is synthesized in a range of a plurality of times to obtain state transition information over that time range. The state transition information is stored in the path memory circuit. By so doing, the trace back to the final stage on the surviving path is performed by gaining much less access to the path memory circuit. It is thus possible to perform a high-speed decoding operation.

In summary, the path select signal represents the state transition information as the adjacent time, that is one time, and in the path memory circuit which stores that signal a trace back has to be effected on the surviving path in a stage-by-stage back-trace fashion. If, however, the state transition information over a range of a plurality of times is handled, a jump-back can be made over a plurality of stages by one memory access. It is, therefore, possible to perform a trace back to the final stage on the surviving path by gaining less access to the path memory.

BRIEF DESCRIPTION OF DRAWINGS

FIGS. 5A and 5B are schematic views of decoding principles for different path lengths in trace back according to the embodiment of the present invention;

FIG. 7 is a schematic view of a unit cell structure according to the embodiment shown in FIG. 6;

FIG. 8 is a block diagram of a decoder according to the embodiment shown in FIG. 6;

FIG. 9 is a schematic view of a survivor path memory circuit consisting of two RAMs so as to correspond to two back tracers;

FIG. 10 is a block diagram in which two ACS circuits are provided to write a plurality of state transition information in a path memory at the same time.

BEST MODE OF CARRYING OUT THE INVENTION

A first embodiment of the present invention will be described in detail with reference to the accompanying drawings.

Figure 4:
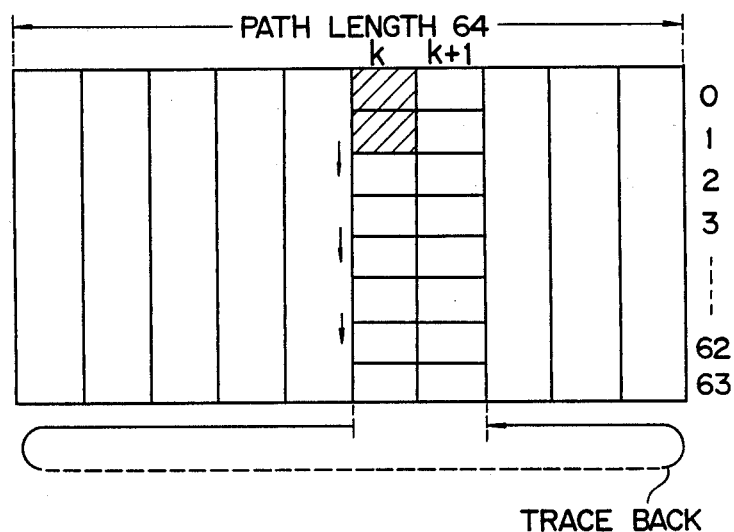
FIG. 4 is a schematic view of a survivor path memory circuit corresponding to a decoder with respect to an encoding ratio of ½ and a constraint length k=7 and having the configuration shown in FIG. 1.

In this embodiment, a code having an encoding ratio of ½ and a constraint length k=7 is used so as not to lose generality. In this case, the number of states on a trellis is $2^{k-1}=2^6=64$. Since a necessary path length of surviving paths is about 4k to 5k=28 to 35, 40 stages are sufficient. Note that in this case, path length of v=64 stages is chosen in consideration of some margin. FIG. 4 schematically shows a corresponding path memory circuit. In FIG. 4, the vertical direction represents states on a trellis, and the horizontal direction represents stages (i.e., times) of a path.

Figure 1:
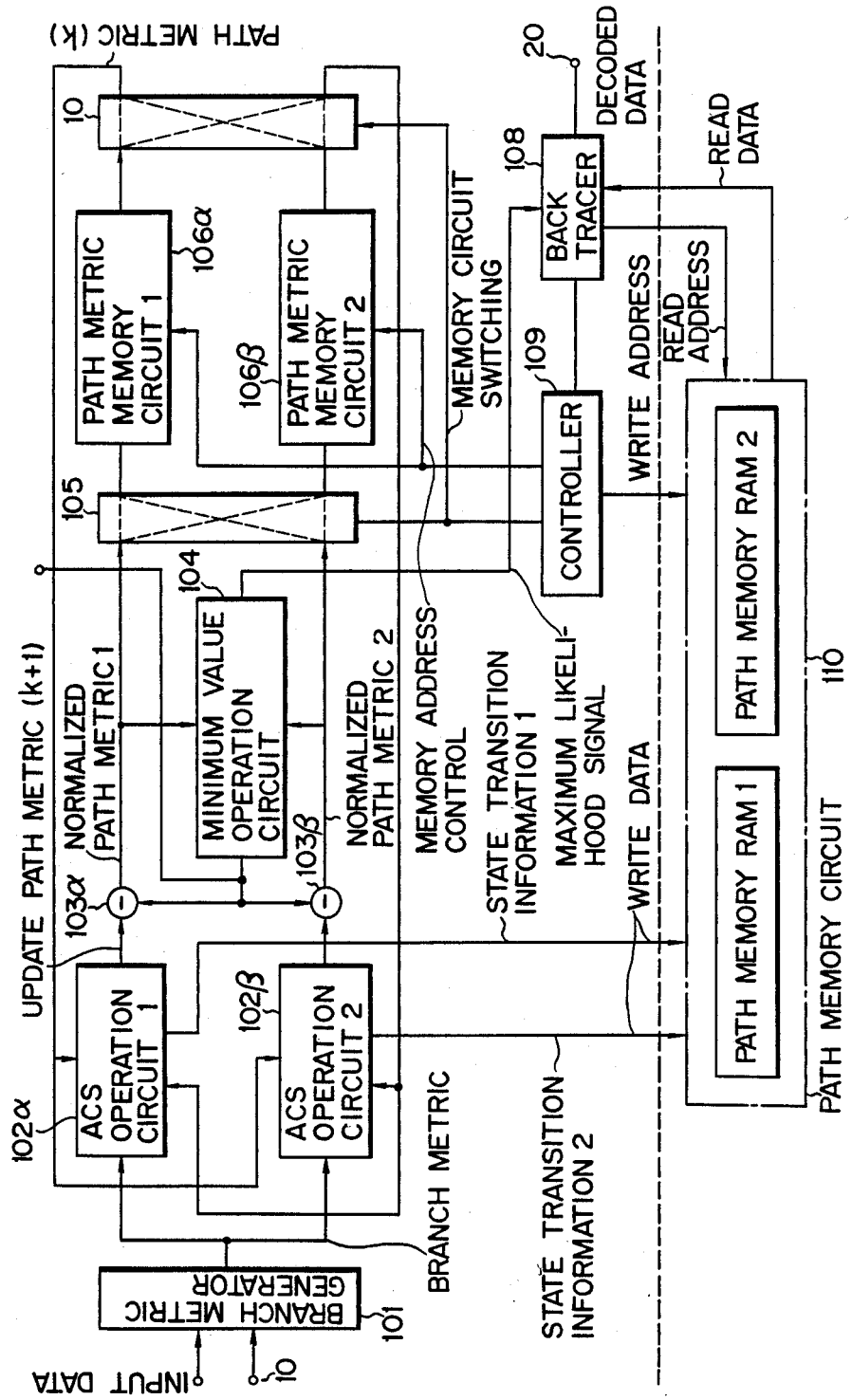
FIG. 1 is a block diagram of a Viterbi decoder for explaining an embodiment of the present invention.

Assume that in accordance with the circuit configuration shown in FIG. 1, state transition information of two states can be obtained and written in the path memory circuit at the same time.

When writing of state transition information and trace back on the memory are to be alternately performed, writing of state transition information in one decoding step is completed by repetition of 32 times (64/2). In this case, the number of stages which can be traced back during this time is only 32, i.e., only a half of the full path length can be traced. Therefore, writing of state transition information with respect to the next time and trace back operation are continuously performed. When writing of state transition information with respect to the next time is completed, trace back reaches a final stage. In this case, since two decoding steps have already passed, two data (i.e., two bits) are decoded when the final stage is reached by trace back.

This 2-bit decoding is very simple. That is, assuming that a state at time k−v which is finally reached by trace back is $\hat{X}_{k-v}$ and its binary expression is $\hat{X}_{k-v}=(\beta_{k-v-5}\beta_{k-v-4}\beta_{k-v-3}\beta_{k-v-2}\beta_{k-v-1}\beta_{k-v})$ (where the left side is older and the right side is newer), decoded data are $\beta_{k-v-5}$ and $\beta_{k-v-4}$. FIGS. 5A and 5B show these decoding principles.

Assume that the circuit configuration of the operation unit of the decoder remains the same and the path length is increased to, e.g., 128 stages. In this case, writing of state transition information and trace back are alternately performed throughout four decoding steps, and when trace back is completed, four decoded data are output at the same time.

The trace back method will be described in more detail. As described above, a method of writing state transition information in a memory circuit has a degree of freedom. In the simplest method, a state on the trellis and an address in the memory circuit are identified. For example, referring to the above case, state transition information corresponding to state "000000" is stored at address 0 of the memory circuit, state transition information corresponding to state "0000001" is stored at address 1 thereof, . . . , state transition information corresponding to state "111111" is stored at address 63 thereof.

In this case, trace back operation corresponds to repetition of a cycle such as access of address $(\beta_1\beta_2\beta_3\beta_4\beta_5\beta_6)$ (in this case, the left side is older and the right side is newer) → reading out of state transition information g (one bit) → determination of next access address $(g\beta_1\beta_2\beta_3\beta_4\beta_5)$ according to a unit cell structure of a code trellis.

On the other hand, if a state on the code trellis and an address in the memory circuit are not identified with each other, state transition information can be written under a predetermined conversion rule.

Figure 6:
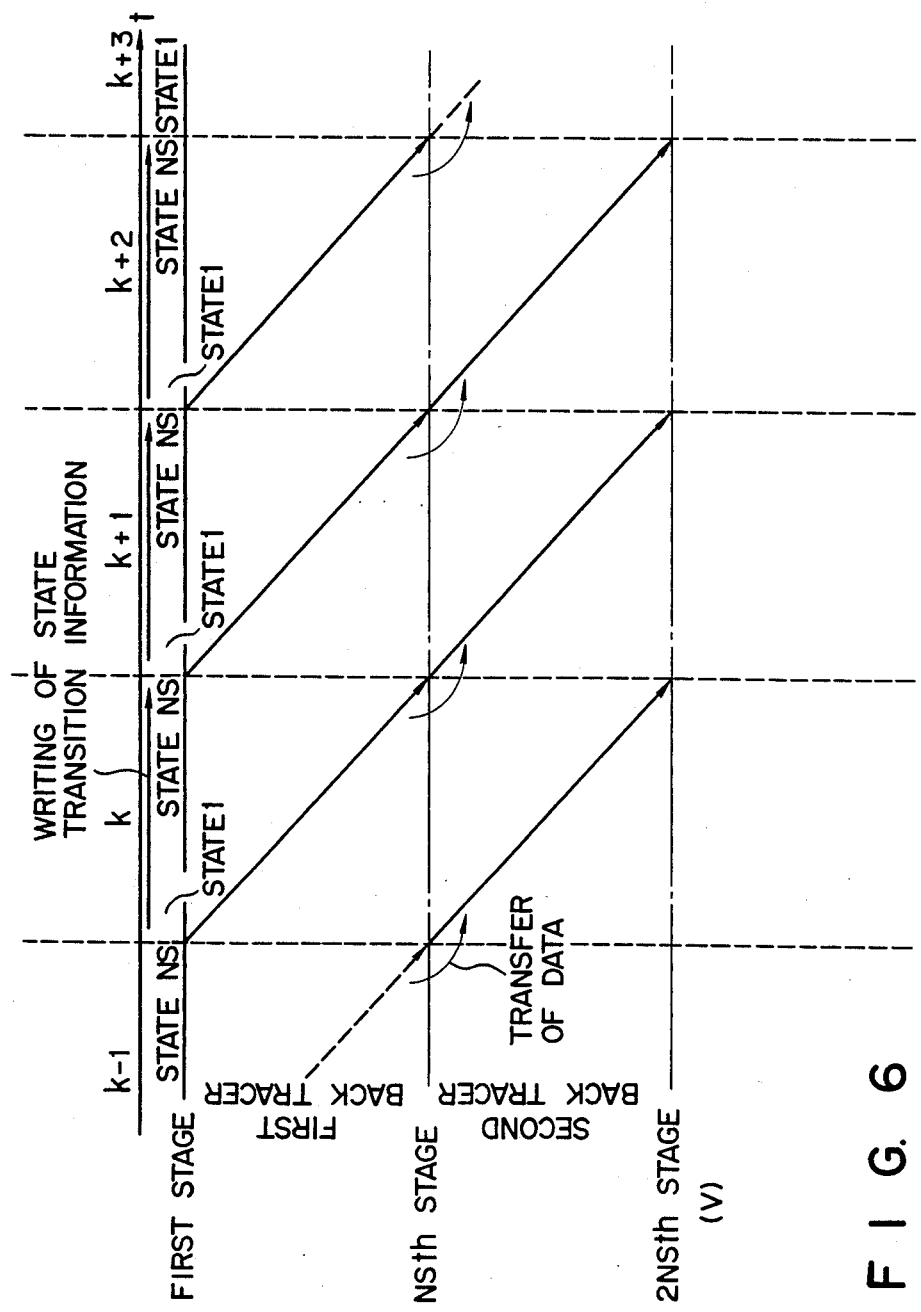
FIG. 6 is a schematic view for explaining a principle of trace back according to another embodiment of the present invention.

FIG. 6 illustrates an example of such a conversion rule in which a time axis is represented as repetitions of six types of modes. For example, when a time of interest is in mode 1, state transition information corresponding to state "000000" is written at address 0 of the memory circuit, state transition information corresponding to state "000001" is written at address 32 thereof, . . . , and so on.

In this case, trace back operation corresponds to repetition of a cycle such as access of address ($\beta_1\beta_2\beta_3\beta_4\beta_5\beta_6$) in mode i → reading out of state transition information g (i bit) → determination of next access address ($\beta_1\beta_2\beta_{i-1}$ g $\beta_{i+1}\beta_6$).

FIG. 6 illustrates trace back operation performed when a starting point is set at address 8 in mode 6.

Note that this example is characterized in that a possibility of tracing back to the same address at an immediately preceding time according to state transition information is ½.

Moreover, an "address" which is finally reached by trace back can be easily converted into a "state" on the trellis in consideration of a mode at the time. Therefore, trace back can be realized in this manner.

In addition, when the operation unit of the decoder is arranged such that state transition information corresponding to a plurality of states can be obtained at the same time, a plurality of (i.e., divided) memory circuits are normally provided to increase a speed of a decoding operation although total easiness remains the same. Also in this case, trace back can be performed in a manner similar to the above case, including discrimination of memory circuits.

Note that especially in a method of separating a "state" on the code trellis from a "memory address", a plurality of trace back operations can be performed independently of each other.

A second embodiment of the present invention will be described below. This embodiment also provides a Viterbi decoding method and a Viterbi decoder which can flexibly correspond to a variation in a surviving path length or a circuit configuration the operation unit of the decoder.

First, the characteristic features of the embodiment will be described in consideration of trace back on a path memory circuit.

A circuit is arranged such that path length v=2Ns where Ns is the number of states on a trellis diagram and only one state transition information corresponding to one state can be obtained by a decoder operation unit at one time. According to a conventional method in which a random-access memory is used as a path memory circuit and writing of state transition information and trace back of one stage are alternately executed, when writing of state transition information with respect to all of the states is completed, trace back can reach only an intermediate point of surviving paths.

Therefore, in this embodiment, a path length is divided into two parts, and two back tracers (means for realizing trace back) are provided. That is, one of back tracers traces back surviving paths from the first to Ns-th stages, and at the same time, the other back tracer traces back from the (Ns+1)-th to 2Ns(=v)-th stages. When writing of state transition information with respect to all of the states at time (k+1) is completed, the second back tracer reaches final stage v of the surviving paths.

FIG. 6 illustrates a principle of trace back in this embodiment. In FIG. 6, while state transition information with respect to each state is written in the path memory circuit, the two back tracers execute trace back at the same time as follows. That is, the first back tracer executes trace back from the first to Ns-th stages of the surviving paths, and the second back tracer receives information of the final stage which is reached by the first back tracer during an immediately preceding time and then executes trace back from the (Ns+1)-th to 2Ns(v)-th stages. When writing of state transition information with respect to all the states is completed, the second back tracer reaches the final stage of the surviving paths so that decoded data is output one by one for each units of decoding times.

Trace back will be described in more detail.

Figure 2A:
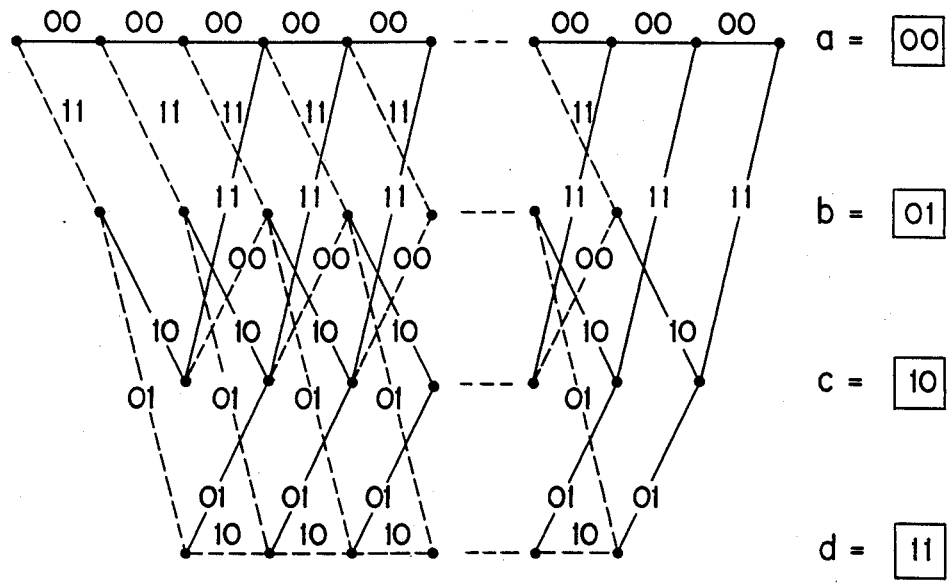
FIGS. 2A and 2B are a code trellis diagram and a schematic view of its unit cell configuration.
Figure 2B:
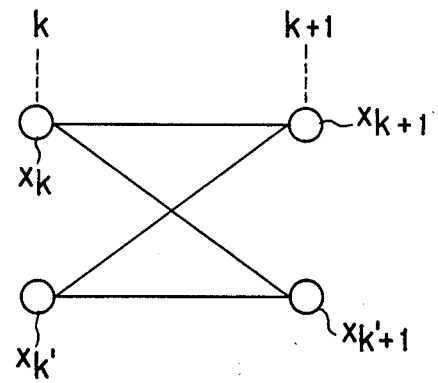

As can be assumed from the trellis diagram of FIG. 2A, note that a unit cell structure (state transition structure between adjacent times) with respect to a normal convolution code having an encoding ratio of ½ and a constraint length of k can be expressed as shown in FIG. 7. Therefore, assuming that state transition information with respect to state $X_{K+1}\Delta(\bar{u}0)$ at time k+1 is i (0 or 1), a state of time k to be reached by trace back can be written as (iū). Similarly, assuming that state transition information with respect to state (iū) is i', a state at time (k−1) to be reached by trace back is (i'i-$u_{k-K+3} \ldots u_{k-1}$). In the same manner, states at immediately preceding times are sequentially determined and trace back is executed.

Therefore, when the path memory circuit is realized by a RAM (Random-Access Memory) and a "state" on the trellis diagram and an "address" in the memory are identified with each other, trace back is performed by repeating a cycle such as "access of a designated address → reading of state transition information from the RAM → determination of an address to be accessed next → access of the designated address".

"Transfer of information" between two back tracers, which is the characteristic feature of the present invention, can be realized without contradiction by using a final state reached by the first back tracer at an immediately preceding time as an initial state of the second back tracer.

Note that decoded data can be determined very easily by the final state $x_{V}{}^{(k)}=(u_{V-K+2}{}^{(k)}, u_{V-K+3}{}^{(k)}, \ldots , u_{V}{}^{(k)})$ of surviving paths reached by the second back tracer. That is, oldest bit $u_{V-K+2}$ of (k−1) bits representing this state is output as decoded data.

The above embodiment will be described in detail. FIG. 8 is a block diagram of a decoder according to this embodiment. In FIG. 8, the decoder comprises branch metric generator 201, ACS circuit 202, path metric memory circuit 203, path memory circuit 206, controllers 204a and 204b, and two back tracers 205a and 205b.

A description will be made below in consideration of, especially, operations of the path metric memory circuit and the two back tracers.

Figure 3:
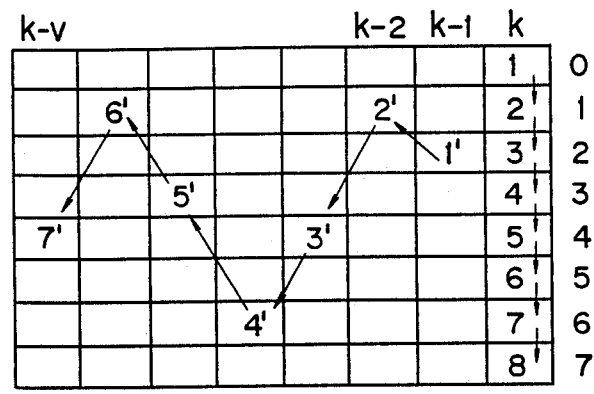
FIG. 3 is a schematic view of a memory circuit for realizing a survivor path memory circuit by a random access memory.

FIG. 9 exemplifies a surviving path memory circuit by two RAMs in correspondence to two back tracers. In FIG. 9, an ordinate corresponds to a "state" and an abscissa corresponds to a "time" as in FIG. 3. However, unlike in FIG. 3, since a time axis is cyclically used, it cannot be considered that the right end represents the newest time and the left end represents the oldest time.

Assume that address (k+1) of the abscissa corresponds to a decoding step of interest. A hatched portion in FIG. 9 represents that state transition information which is newly obtained from a decoder operation unit is written in the memory circuit.

In FIG. 9, before writing with respect to the hatched portion is completed, the two back tracers trace back the regions assigned thereto, respectively. In order for the two back tracers to simultaneously execute trace back operation, the two back tracers must always access RAMs different from each other. In this case, as is apparent from FIG. 9, the two back tracers execute trace back operation while accessing the different RAMs.

Moreover, in FIG. 9, information is transferred between the two back tracers. That is, a state reached by the first back tracer at time (k+1) is a starting state of the second back tracer at time (k+2), and a state finally reached by the second back tracer is a decoding state at the time. When a decoding state is determined, its column is no longer necessary with respect to the time base, so that state transition information at the time is newly written in the column (i.e., two hatched portions at time (k+2)). By controlling the path memory circuit in this manner, decoded data can be output even for a longer path without contradiction.

In the above description, as is apparent from the configuration shown in FIG. 8, state transition information of one state is obtained at a time in the decoder operation unit. However, depending on a circuit configuration, state transition information of a plurality of states are sometimes obtained at the same time.

FIG. 10 is a block diagram in which two ACS circuits 202a and 202b are provided to obtain state transition information of two states at the same time. In this configuration, a plurality of state transition information are written in path memory circuit 206 at the same time. At this time, according to a method in which writing of state transition information to circuit 206 and trace back of one stage are alternately repeated, even if the number of states on the trellis diagram is the same as the path length, trace back is completed only by half when writing of state transition information with respect to all the states is completed. Therefore, trace back operation performed by two back tracers can be applied to this case.

Note that since state transition information of two states obtained by the decoder operation unit are written at the same time, a circuit configuration of path memory circuits is divided into two with respect to a state axis unlike in FIG. 8. However, total easiness remains the same.

A third embodiment will be described below. In this embodiment, by combining path selection signals, each representing state transition information between adjacent times as shown in FIG. 2A, into one transition information throughout a plurality of times, trace back on a surviving path memory circuit can be performed with a smaller number of access times, thereby realizing high-speed decoding.

A method of combining path selection signals according to this embodiment will be described below using $r=\frac{1}{2}$ and $K=3$ without loss of generality.

Since $K=3$, the code trellis is represented by $2^{K-1}=2^{3-1}=2^2=4$ states.

Assume that path selection signals for the respective states at time v are written as $j_0(v)$ to $j_3(v)$. This means that surviving paths for the respective states are completed as follows:

... $j_0(v)00$
... $j_1(v)01$
... $j_2(v)10$
... $j_3(v)11$

Therefore, these are equivalent to the following state transitions:

$(j_0(v)0) \rightarrow (00)$
$(j_1(v)0) \rightarrow (01)$
$(j_2(v)1) \rightarrow (10)$
$(j_3(v)1) \rightarrow (11)$ Using this principle, path selection signals at two times can be combined with each other. For example, assume that:

$j_0(v)=1$  $j_0(v+1)=1$
$j_1(v)=0$  $j_1(v+1)=0$
$j_2(v)=0$  $j_2(v+1)=1$
$j_3(v)=1$  $j_3(v+1)=0$

Under the condition $t=v$:
$(10) \rightarrow (00)$
$(00) \rightarrow (01)$
$(01) \rightarrow (10)$
$(11) \rightarrow (11)$ In addition, under the condition $t=v+1$:
$(10) \rightarrow (00)$
$(00) \rightarrow (01)$
$(11) \rightarrow (10)$
$(01) \rightarrow (11)$ Therefore, a sum is obtained as follows:
$v+(v+1)$
$(01) \rightarrow (00)$
$(10) \rightarrow (01)$
$(11) \rightarrow (10)$
$(00) \rightarrow (11)$
(*)

This represents that state "01" preceding by two times, transits to state "00" on the trellis at time (v+1), state "10" preceding by two times, transits to state "01" on the trellis at time (v+1), and the like.

Actually, such addition can be easily achieved by the following sequence:

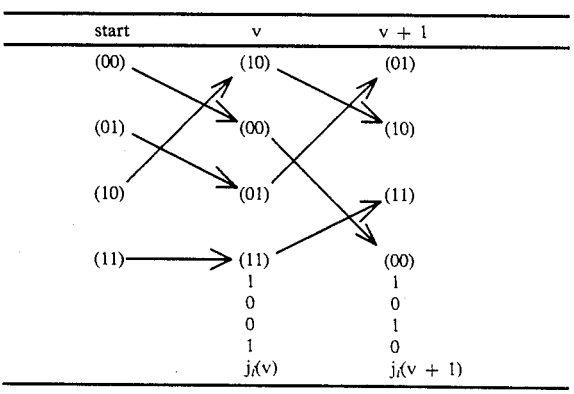

| start | v | v + 1 |
|---|---|---|
| (00) | (10) | (01) |
| (01) | (00) | (10) |
| (10) | (01) | (11) |
| (11) | (11) | (00) |
|  | 1 | 1 |
|  | 0 | 0 |
|  | 0 | 1 |
|  | 1 | 0 |
|  | $j_i(v)$ | $j_i(v+1)$ |

That is, in combination with a cell structure:
$j_0(v)=1$ represents transition $2 \rightarrow 0$
$j_1(v)=0$ represents transition $0 \rightarrow 1$
$j_2(v)=0$ represents transition $1 \rightarrow 2$
$j_3(v)=1$ represents transition $3 \rightarrow 3$ Therefore, a combination of numerals at the start may be replaced in accordance therewith.

Similarly, this procedure applies to $t=v+1$.

In this case, the following column is obtained:
(01)
(10)

(11)
(00)

The above column completely coincides with that indicated by (*).

Note that the combining method mentioned last, is a method of forwardly combining in accordance with the order by which path selection signals are obtained and hence is very convenient in data processing.

In the following description, actually obtained path selection signals will be combined with each other to form state transition information throughout a plurality of times, and it will be confirmed that trace back on the basis of composite data is substantially the same as conventional trace back.

For example, assume that path selection signals are obtained as follows:

| state | time t | | | | |
|---|---|---|---|---|---|
| | v | v + 1 | v + 2 | v + 3 | v + 4 |
| "00"(0) | 1 | 1 | 0 | 1 | 0 |
| "01"(1) | 0 | 0 | 1 | 0 | 1 |
| "10"(2) | 0 | 1 | 1 | 0 | 1 |
| "11"(3) | 1 | 0 | 1 | 0 | 0 |
| | v + 5 | v + 6 | v + 7 | | |
| | 0 | 0 | 0 | | |
| | 0 | 1 | 1 | | |
| | 1 | 0 | 1 | | |
| | 1 | 0 | 0 | | |

Assume that signals are combined every two steps without loss of generality:

| v | v + 1 | start | v ⟶ (v + 1) |
|---|---|---|---|
| 1 | 1 | 10) | (01) |
| 0 | 0 | 00) | (10) |
| 0 | 0 | 01) | (11) |
| 1 | 0 | 11) | (00) |

(a)

| v + 2 | v + 3 | start | (v + 2) ⟶ (v + 3) |
|---|---|---|---|
| 0 | 1 | (00) | (00) | (11) |
| 1 | 0 | (01) | (10) | (00) |
| 1 | 0 | (10) | (11) | (10) |
| 1 | 0 | (11) | (01) | (10) |

(b)

| v + 4 | v + 5 | start | (v + 4) ⟶ (v + 5) |
|---|---|---|---|
| 0 | 0 | (00) | (00) | (00) |
| 1 | 0 | (01) | (10) | (00) |
| 0 | 1 | (10) | (11) | (01) |
| 0 | 1 | (11) | (01) | (01) |

(c)

| v + 6 | v + 7 | | (v + 6) ⟶ (v + 7) |
|---|---|---|---|
| 0 | 0 | (00) | (00) | (00) |
| 1 | 1 | (01) | (10) | (01) |
| 0 | 1 | (10) | (01) | (01) |
| 0 | 0 | (11) | (01) | (10) |

(d)

Therefore,

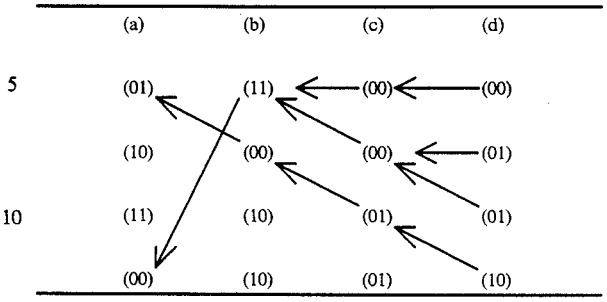

is obtained. When this is traced back:
(00)→(00)→(11)→(00)
(01)→(00)→(11)→(00)
(10)→(00)→(11)→(00)
(11)→(01)→(00)→(01)

On the other hand, trace back is performed by a conventional method in accordance with the original path selection signals:

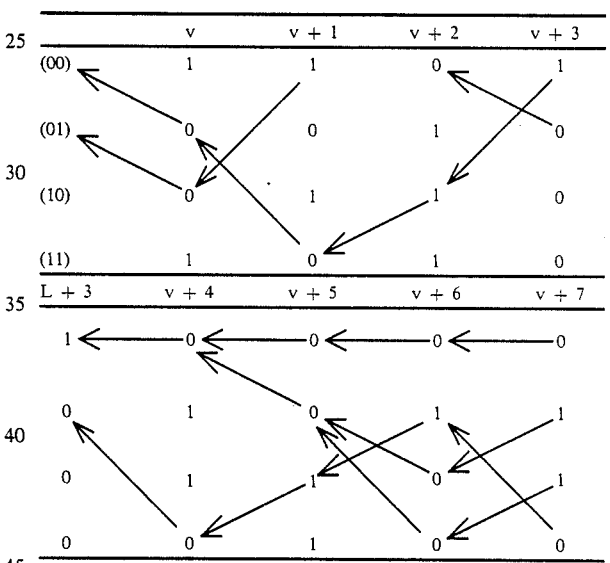

Therefore,
v + 7    v − 1
(00)→(00)
(01)→(00)
(10)→(00)
(11)→(01)

This coincides with the result obtained by the above combining method. Therefore, trace back can be realized also in accordance with composite data obtained by combining path selection signals throughout a plurality of times without contradiction.

As a result, the following method can be adopted.

Step 1 Composite state transition information throughout a plurality of times is formed.

Step 2 Trace back is performed in accordance with the composite state transition information.

The above example is also used in this method. That is:

| state | time t | | | |
|---|---|---|---|---|
| | v | v + 1 | v + 2 | v + 3 |

-continued

| | time t | | | |
|---|---|---|---|---|
| 0 | 1 | 1 | 0 | 1 |
| 1 | 0 | 0 | 1 | 0 |
| 2 | 0 | 1 | 1 | 0 |
| 3 | 1 | 0 | 1 | 0 |
| | └─Composite─┘ | | └─Composite─┘ | |
| | Transition | | Transition | |
| v + 4 | v + 5 | v + 6 | v + 7 | |
| 0 | 0 | 0 | 0 | |
| 1 | 0 | 1 | 1 | |
| 1 | 1 | 0 | 1 | |
| 0 | 1 | 1 | 0 | |
| └─Composite─┘ | | └─Composite─┘ | | |
| Transition | | Transition | | |

(01)──▶(00)    (11)──▶(00)

(10)──▶(01)    (00)──▶(01)

(11)──▶(10)    (10)──▶(10)

(00)──▶(11)    (10)──▶(11)

(00)──▶(00)    (00)──▶(00)

(00)──▶(01)    (01)──▶(01)

(01)──▶(11)    (10)──▶(11)

Therefore, the path memory circuit is arranged as follows:

| ← Time — | | | | |
|---|---|---|---|---|
| v, v + 1 | v + 2, v + 3 | v + 4, v + 5 | v + 6, v + 7 | |
| 01 | 11 | 00 | 00 | "00" |
| 10 | 00 | 00 | 01 | "01" ↓ State |
| 11 | 10 | 01 | 01 | "10" ↓ |
| 00 | 10 | 01 | 10 | "11" |

In the following description, data 01 at an intersection between state "00" and time v,v+1 is written as $l_0(L)$, data 11 at an intersection between state "00" and time v+2,v+3 is written as $l_0(v+2)$, and the like.

The embodiment in which a random-access memory is used as a path memory circuit will be described in more detail.

In order to explain a decoding procedure, it is enough to show a timing chart showing, in accordance with path selection signals obtained from the decoder operation unit, combination of the path selection signals, writing of composite state transition information in the path memory circuit, reading from the path memory circuit for trace back, and a final decoding method.

Figure 11A:
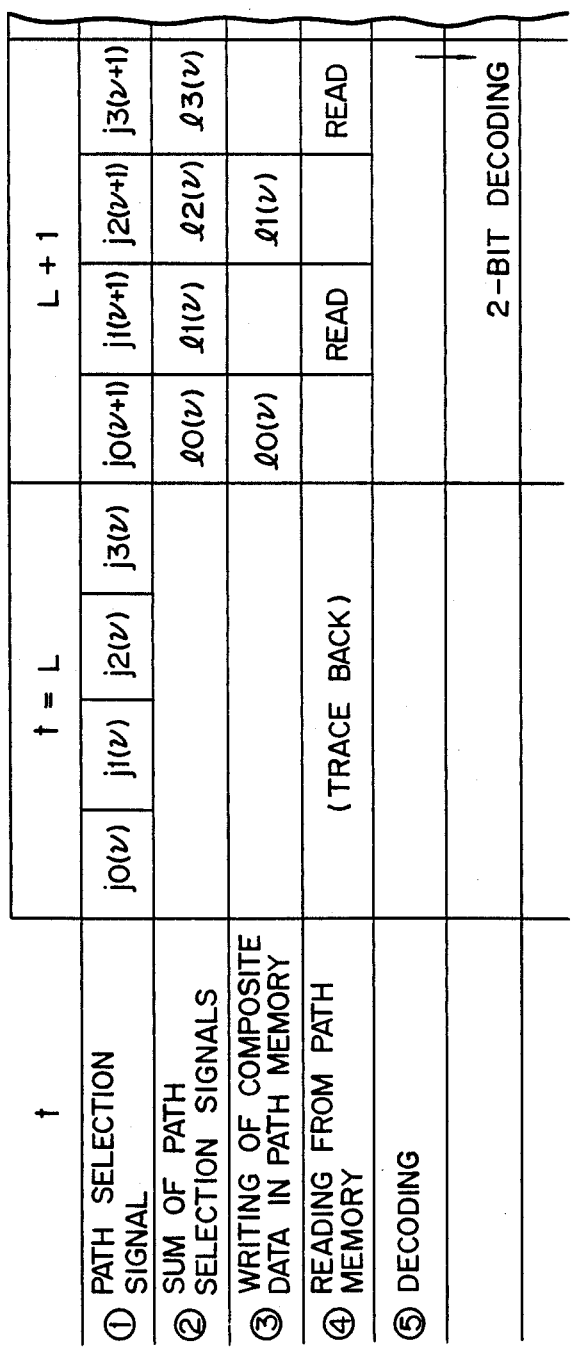
FIG. 11A and FIG. 11B are a timing chart of a decoding sequence for explaining still another embodiment of the present invention.
Figure 11B:
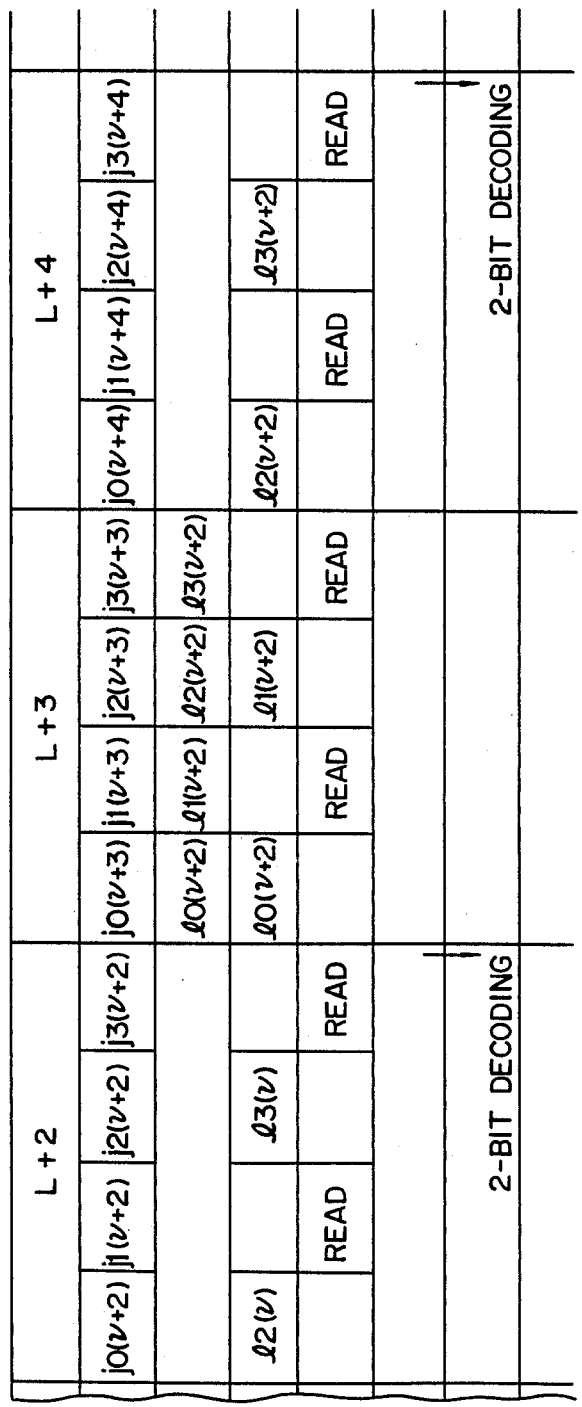

FIG. 11A and FIG. 11B are timing charts showing an operation of a path memory circuit in the Viterbi decoder in the embodiment with respect to a code of $r=\frac{1}{2}$ and K=3.

In FIG. 11A and FIG. 11B, ① represents how the path selection signal is obtained. That is, path selection signals with respect to four states at the respective times are sequentially obtained under the condition of K=3.

② represents addition of the path selection signals obtained in ① between two times. That is, when path selection signal $j_i(v+1)$ ($0 \leq i \leq 3$) at time (v+1) is combined with path selection signal $j_i(v)$ at an immediately preceding time, composite state transition signal $l_i(v)$ is obtained.

③ represents writing of composite transition information obtained in ② in the RAM. That is, it is enough to write four transition information $l_0(v)$ to $l_3(v)$ in the memory throughout two time slots.

④ corresponds to trace back. In this case, a method in which writing and reading of data with respect to the path memory circuit are alternately performed is adopted. That is, the composite transition information formed is read out every time writing is performed in ③ from the memory to execute trace back.

As has been described above, path selection signals can be combined with each other in accordance with the order in which the path selection signals are obtained, resulting in a convenient arrangement. In addition, a time length required for combination can be arbitrarily changed in accordance with a variation in a survivor path length. Moreover, the trace back method according to the present invention can be considered as a natural extension of a conventional trace back method in units of stages and hence has good compatibility with a conventional technique.

As shown in the embodiments described above, the path memory control method in a Viterbi decoder, according to the present invention for use in a Viterbi decoder based on a trace back on a path memory circuit can flexibly cope with a variation in a surviving path length or in a circuit configuration. For example, in order to realize a surviving path memory circuit by a random-access memory, only an address control needs to be changed to cope with this variation.

In addition, trace back control in the surviving path memory circuit is basically independent of control of the decoder operation unit. However, by separating a "state" on the code trellis from state transition information with respect to the state, trace back control can be synchronized with address control of the path metric memory circuit.

When the above Viterbi decoder is to be implemented into an LSI, as is apparent from the configuration in FIG. 8, a circuit group consisting of branch metric generator 201, ACS circuit 202, path metric memory circuit 203, and a controller 1, 204a and another circuit group consisting of controller 2, 204b, back tracers 205a and 205b, and memory circuit 206 can be mechanically separated from each other. Therefore, a mode in which these functions can be used separately from the exterior can be provided. This separation of functions is effective to, e.g., increase the path lenth, since a function of only the path memory circuit can be added to the other circuits.

As is well known, in the Viterbi decoder, a hardware complexity occupied by a path memory circuit is very large. Therefore, the path memory circuit may be arranged outside the LSI and controlled by a controller which is fabricated as an LSI together with other circuits.

We claim:

1. A path memory control method of a Viterbi decoder comprising the steps of:
   storing state transition information between a predetermined time and a time, as a surviving path, in a path memory circuit in accordance with a unit cell structure of a code trellis diagram;
   determining decoding data by a trace back on the basis of the state transition information which is stored in the path memory circuit; and outputting encoding data, corresponding in number to the plurality of decoding steps, from the path memory circuit, at a time when a plurality of decoding steps are required in a trace back to a final stage on the surviving path.

2. The method according to claim 1, wherein said storing step and said determining step are performed in alternating fashion.

3. The method according to claim 1, wherein said determining step requires a plurality of decoding steps to a final stage on said surviving path and performs a plurality of trace-back steps in an independent fashion.

4. The method according to claim 3, wherein said determining step traces back a different area of each surviving path and sets information on a final stage on one trace back area, as initial-stage information, to the next trace back area.

5. The method according to claim 1, wherein said storing step stores state transition information over a range of a plurality of times and said determining step traces back the state transistion information corresponding to the plurality of times over a range of a plurality of stages.

6. The method according to claim 5, wherein said determining step includes a step by which state transition information over a range of a plurality of times on said code trellis diagram is obtained by synthesizing, in a time sequence, path selection signals of the corresponding times which are obtained by said computation unit and a trace-back is made to a final stage on said surviving path by a jump back which is performed, a plurality of stages at a time, on the basis of the state transition information.

* * * * *